(12) United States Patent
Marie et al.

(10) Patent No.: US 8,173,448 B2
(45) Date of Patent: May 8, 2012

(54) WAFER WITH SCRIBE LANES COMPRISING EXTERNAL PADS AND/OR ACTIVE CIRCUITS FOR DIE TESTING

(75) Inventors: Herve Marie, Caen (FR); Sofiane Ellouz, Paris (FR)

(73) Assignee: NXP B.V., Eindhoven (NL)

( * ) Notice: Subject to any disclaimer, the term of this patent is extended or adjusted under 35 U.S.C. 154(b) by 929 days.

(21) Appl. No.: 12/067,980

(22) PCT Filed: Sep. 25, 2006

(86) PCT No.: PCT/IB2006/053476
§ 371 (c)(1),
(2), (4) Date: Aug. 22, 2008

(87) PCT Pub. No.: WO2007/036867
PCT Pub. Date: Apr. 5, 2007

(65) Prior Publication Data
US 2009/0127553 A1    May 21, 2009

(30) Foreign Application Priority Data

Sep. 27, 2005  (EP) .................................... 05300778

(51) Int. Cl.
*G01R 31/26*    (2006.01)
*H01L 21/66*    (2006.01)

(52) U.S. Cl. ......................................................... 438/14
(58) Field of Classification Search ..................... 438/14
See application file for complete search history.

(56) References Cited

U.S. PATENT DOCUMENTS

| | | | |
|---|---|---|---|
| 6,124,143 A | 9/2000 | Sugasawara | |
| 6,939,727 B1 * | 9/2005 | Allen et al. | ..................... 438/14 |
| 2005/0085032 A1 | 4/2005 | Aghababazadeh et al. | |

FOREIGN PATENT DOCUMENTS

EP          1284499 A2      2/2003

* cited by examiner

Primary Examiner — Jenny L Wagner

(57) ABSTRACT

A wafer comprises i) at least one independent die having internal integrated components, a multiplicity of internal pads connected to some of the internal integrated components, ii) scribe lanes defined between and around each independent die, and in part of which are defined, for each die, at least a first group of external pads and/or a second group of external test integrated components. The external pads of each first group are connected, through conductive tracks, to a chosen one of the internal pads and/or internal integrated components of the associated die, and arranged to be fed with chosen test signals or to collect test result signals. Each external test integrated components of each second group is connected, through conductive tracks, to a chosen one of the die internal pads and/or die internal integrated components and/or to external pads of a first group.

11 Claims, 2 Drawing Sheets

WAFER WITH SCRIBE LANES COMPRISING EXTERNAL PADS AND/OR ACTIVE CIRCUITS FOR DIE TESTING

FIELD OF THE INVENTION

The present invention relates to the domain of integrated circuits, and more precisely to the test of integrated circuits (or dies) defined in wafers.

BACKGROUND OF THE INVENTION

As is known by one skilled in the art dies must be tested before being integrated with electronic equipment. For practical reasons they are tested when they still belong to their wafer, i.e. before they are separated from one another by a cut-off process along scribe lanes (or lines) defined therebetween.

Each die comprises internal pads allowing connection for wafer tests through the needles of a probe card and for the final application (e.g. wire bonding in a package). Sometimes one or more internal (test) circuits are added to the die to facilitate the wafer testing.

The dies may be tested one after the other by means of a probe card controlled by automated test equipment (ATE) and comprising needles for contacting some of their pads to provide their test circuits and some of their integrated components with test values of voltage or current or to collect the voltage or current they output. In this case the wafer is mechanically moved relative to a probe card for each of its dies to be tested. The time for moving the wafer from a die to a neighboring one takes typically 0.8 second, which is not negligible compare to the time required for testing one die. So this method of testing wastes a lot of time when the wafer comprises numerous dies, which is generally the case.

In order to reduce the wasted time and the number of tests carried out on a wafer it is also possible to test several dies in parallel. But this requires more automated test equipment (ATE) resources and a more complex probe card with much more contact needles, which induces mechanical issues and increases the probability of damaging the pads.

In other respects, and as mentioned before, a pad has a wafer testing function and a wire soldering (or alternatively bumping) function. Requirements for implementing these two functions are difficult to meet, notably because needles used for test connection have a mechanical impact which makes soldering more difficult. Moreover, wafer testing requires pads with a greater size than the one required for soldering size. Therefore, the die size is increased because of the wafer tests. Moreover, with all external circuitry that allows wafer testing, such as decoupling capacitors, loop filters, radio frequency (RF) probes, which are located on the probe card which is behind the connection needles, the wire parasitic associated with the needles reduces the ability of testing at high frequencies.

SUMMARY OF THE INVENTION

So, the object of this invention is to improve the situation.

For this purpose, it provides a wafer comprising at least one independent die having internal integrated components, a multiplicity of internal pads connected to some of its internal integrated components, and scribe lanes defined between and around each independent die.

This wafer is characterized in that it comprises, defined in at least a part of its scribe lanes, and for each die, at least:

a first group of external pads connected through conductive tracks to a chosen one of the internal pads and/or internal integrated components of the associated die, and arranged to be fed with chosen test signals or to collect test result signals, and/or a second group of external test integrated components connected, through conductive tracks to a chosen one of the die internal pads and/or die internal integrated components and/or to external pads of the first group.

The wafer according to the invention may have additional characteristics considered separately or combined, and notably:

in the presence of at least two independent dies, at least some of the external test integrated components of the second group may be dedicated to the electronic selection of dies and/or the electronic selection of die internal pads and/or die internal integrated components and/or other external test integrated components of the second group;

in the presence of at least two independent and identical dies in a row or column, it may also comprise i) a number of buses equal to the number of external pads associated with one die, the same external pad associated with each die being connected to the associated bus, ii) a number of switch means equal to the number of external pads associated with one die, each switch means associated with each die being connected to the bus to which is connected the corresponding external pad and to the internal pad or internal integrated component associated with the corresponding external pad, and iii) a control track comprising a number of switch control means equal to the number of dies, each switch control means having an output coupled to a control input of each switch means of the corresponding die and being arranged to deliver selectively, on its output, command signals intended for setting the corresponding switch means either to a closed state or an open state;

it may further comprise i) a number of third groups of auxiliary external pads equal to the number of dies and each comprising at least a first auxiliary external pad intended for feeding the corresponding switch control means with first control signals to set it either to an active state or a passive state, a second auxiliary external pad intended for feeding the corresponding switch control means with second control signals intended for defining command signals for the control input of each switch means and a third auxiliary external pad intended for feeding the corresponding switch control means with clock signals to control the transfer of a token from the corresponding switch control means to the following one to the control track, ii) a control bus connected to the second auxiliary external pad of each third group and to the switch control means that each second auxiliary external pad is intended for feeding, and iii) another control bus connected to the third auxiliary external pad of each third group and to the switch control means that each third auxiliary external pad is intended for feeding;

at least one of the third groups may also comprise i) a fourth auxiliary external pad intended for feeding at least one switch control means and/or one switch means and/or one die and/or some of the external test integrated components with a chosen supply voltage, and ii) another control bus connected to the fourth auxiliary external pad of each third group and to each means that each fourth auxiliary external pad is intended for feeding;

at least one of the third groups may also comprise a fifth auxiliary external pad intended for defining ground for the wafer, and ii) another control bus connected to the fifth auxiliary external pad of each third group and to each means for which each fifth auxiliary external pad is intended for defining ground;

each switch control means may comprise a multiplexer and a D-type flip-flop connected to each other;

for instance the external test integrated components may be chosen in a group comprising at least a decoupling capacitor, a resistor, a loop filter, a signal generator, a signal processing component (such as an analog to digital converter (ADC) or a digital to analog converter (DAC) or else a multiplexer), a signal conditioning component (such as an amplifier or a buffer), and a sensor (such as a current sensor, a frequency sensor or a noise sensor).

BRIEF DESCRIPTION OF THE DRAWINGS

Other features and advantages of the invention will become apparent on examining the detailed specifications hereafter and the appended drawings, wherein.

The appended drawings may not only serve to complete the invention, but also to contribute to its definition, if need be.

DESCRIPTION OF THE PREFERRED EMBODIMENTS

The invention aims notably at reducing the time wasted because of the wafer displacement during the die tests and/or the die pad size and pitch while preventing an internal pad from being damaged during the tests, and/or at saving the tester resources and/or needles, and/or at improving the accuracy of at least some measurements.

Figure 1:
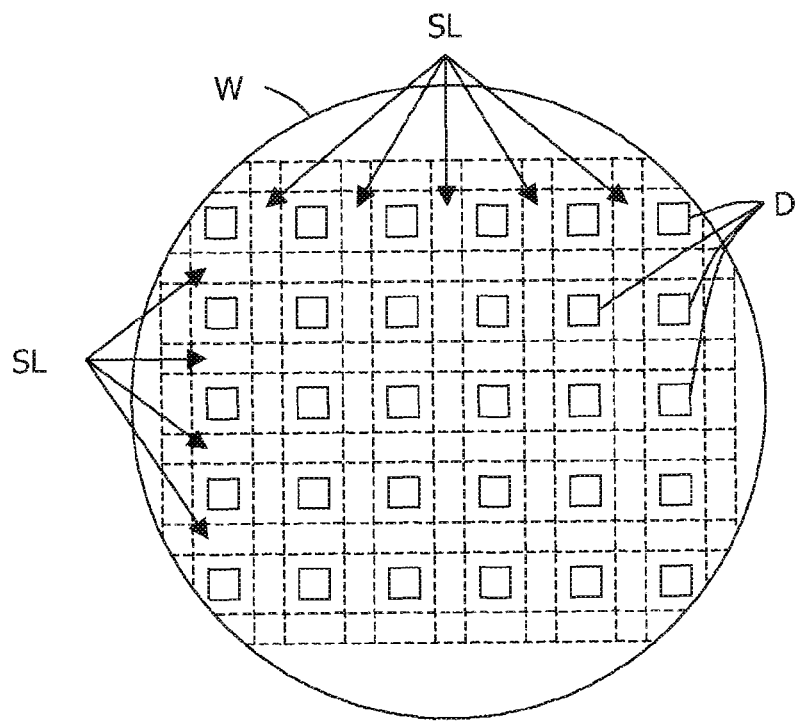
FIG. 1 schematically illustrates a wafer according to the invention.

As is schematically illustrated in FIG. 1, several (at least two) independent dies (or integrated circuits) D are usually defined in a wafer W, for instance of the semiconductor type. These dies are interspaced according to a chosen template (or pattern) which allows their being cut-off along scribe lanes (or lines) SL (schematically realized in dotted lines in FIG. 1). In other words, because of the space left between the independent dies D, scribe lanes SL are defined between and around the independent dies D.

In the following description it will be considered that the wafer comprises dies that are intended to be integrated with the transceiver of communication equipment such as a mobile telephone adapted for radio communication, for instance in a GSM or UMTS network. But it is important to notice that the invention is not limited to this type of electronic equipment. It may apply to any integrated circuit whatever its functionality, and notably to RF integrated circuits or digital circuits.

Figure 3:
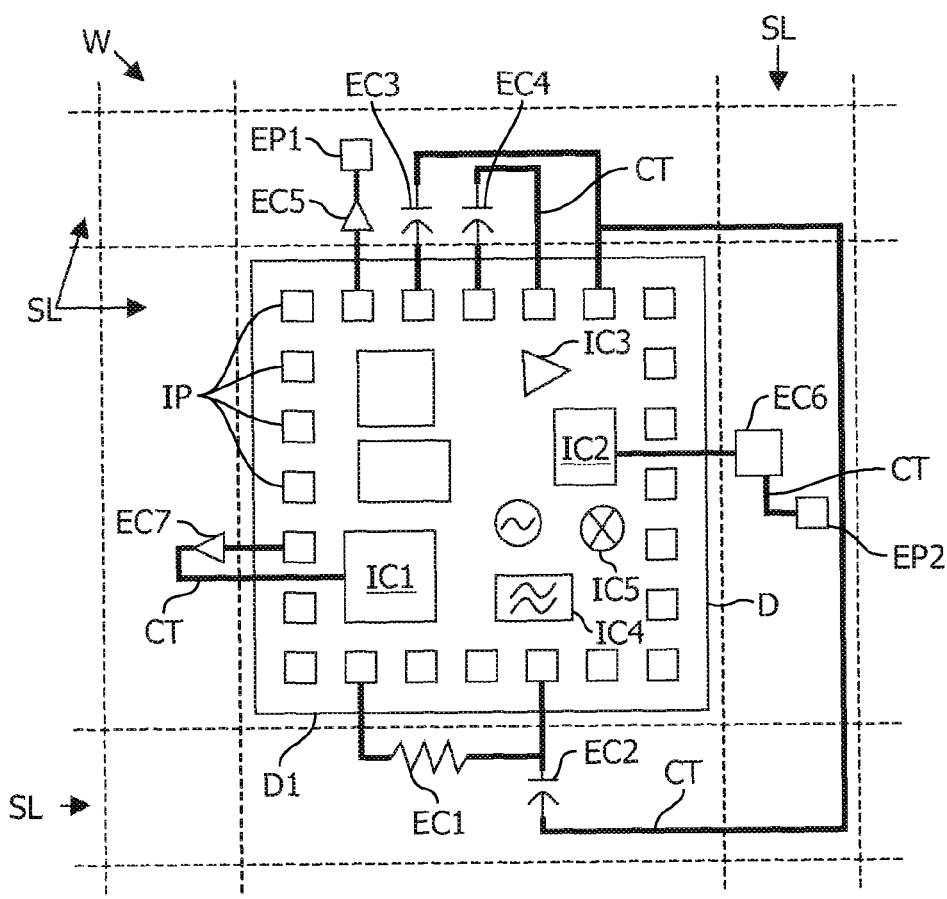
Figure 2:
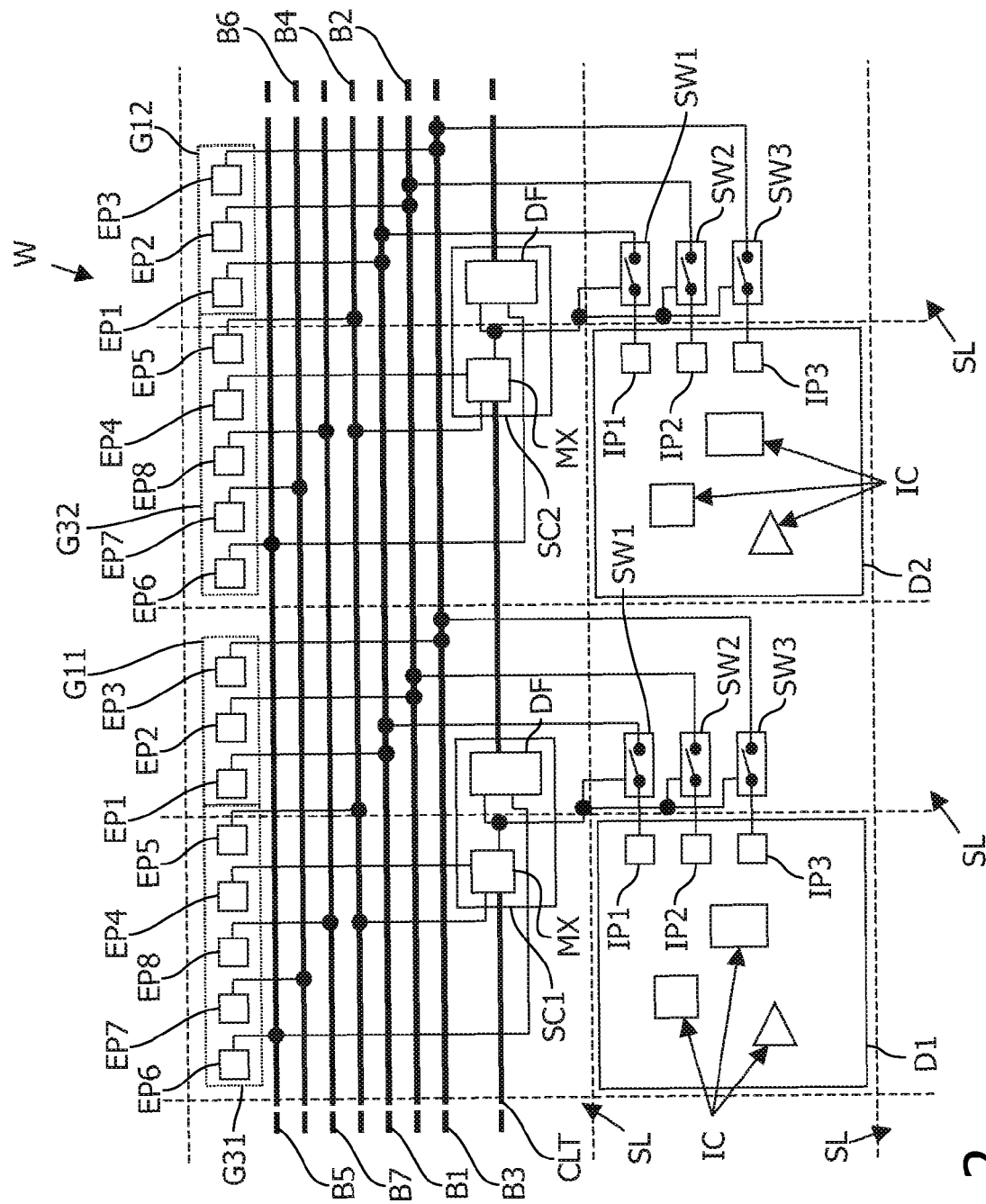
FIG. 2 schematically illustrates a first example of embodiment of a part of a wafer according to the invention, and FIG. 3 schematically illustrates a second example of embodiment of a part of a wafer according to the invention.

As illustrated in the first and second examples of embodiment sketched in FIGS. 2 and 3 respectively, the invention offers to define, in at least a part of the wafer scribe lanes SL and for each wafer die Di, a first group G1i of external pads (or clone pads) EPj (see FIG. 2) connected through conductive tracks to a chosen one of the die internal pads IPj and/or the die internal integrated components IC (see FIG. 3), and/or a second group G2i of external test integrated components ECk (see FIG. 3) connected through conductive tracks to a chosen one of the die internal pads IPj and/or die internal integrated components IC and/or to die external pads EPj of the first group G1i.

According to the invention, a die external pad EPj of the first group G1i is arranged either to be fed by means of a probe card (for instance through needles, or with any other probing technique) with chosen test signals intended for the internal pad IPj or internal integrated component IC it is connected to, or to collect test result signals delivered by the internal pad IPj or internal integrated component IC it is connected to, in order to feed the probe card (for instance through one of its needles).

In the first example of embodiment illustrated in FIG. 2, two identical and independent dies D1 and D2 (i=1 or 2) have been materialized for clarity. But the wafer W according to the invention may comprise only one die (as is the case in FIG. 3) or more than two identical and independent dies. Moreover, in the first example of embodiment illustrated in FIG. 2, three internal pads IP1, IP2 and IP3 (j=1 to 3) have been materialized on each die Di. But each die Di of a wafer W according to the invention may comprise one or two internal pads or more than three internal pads IP (as it is the case in FIG. 3).

Reference is now made exclusively to FIG. 2 to describe in detail the first example of embodiment of a wafer W according to the invention.

In this first example each wafer die Di is associated with a first group G1i of external pads (or clone pads) EPj connected, through conductive tracks, to a chosen one of its internal pads IPj.

The wafer W comprising numerous independent and identical dies Di, it is preferable that it further comprises at least buses Bj, switch means SWj and control track(s) CLT.

More precisely, there are as many buses Bj (j=1 to 3) as external pads EPj in a first group G1i associated with a die Di, so that the same external pads EPj of each die Di belonging to a same row or column of the wafer W, is connected together to a same bus Bj. So, in this example the external pads EP1, EP2 and EP3 of each die D1 and D2 are connected to buses B1, B2 and B3 respectively.

Each external pad EPj of a first group G1i is associated with a switch means SWj which is connected to the corresponding bus Bj and to the corresponding internal pad IPj (in this example) through conductive tracks. Each switch means SWj is an external test integrated component.

Each switch means SWj is an active switch which can be set, through a command input, to a closed state in which it authorizes the coupling between an internal pad IPj (or an internal integrated component IC) and the corresponding external pad EPj, or to an open state in which it prevents such a coupling. So, in this example the external pads EP1, EP2 and EP3 of each die D1 and D2 may be coupled to internal pads IP1, IP2 and IP3 respectively through the bus B1 and the switch means SW1, the bus B2 and the switch means SW2, and the bus B3 and the switch means SW3.

The control track CLT (which is associated with the row (or column) to which the dies Di belong) comprises a number of switch control means SCi which is equal to the number of dies Di belonging to this row or column. Each switch control means SCi is an external test integrated component.

Each switch control means SCi has an output coupled to the command input of each switch means SWj of the corresponding die Di and is arranged to deliver selectively, on this output, the command signals intended for setting the respective states of these switch means SWj.

For instance and as illustrated, each switch control means SCi may comprise a multiplexer MX and a D-type flip-flop DF connected to each other.

To provide each switch control means SCi with control signals so that it can control the corresponding switch means SWj, third groups G3i of auxiliary external pads EPn are defined in the scribe lanes SL of the wafer W.

Each die Di is associated with one third group G3i.

A third group G3i comprises at least three auxiliary external pads EP4, EP5 and EP6.

The first auxiliary external pad EP4 is intended for feeding the switch control means SCi associated with its third group G3i with first control signals. These first control signals are intended for setting a switch control means SCi either to an active state or a passive state. For instance, each first auxiliary external pad EP4 is connected to a first control input of the multiplexer MX, which belongs to the switch control means SCi corresponding to its third group G3i, through a conductive track.

Each multiplexer MX also has a second control input to receive second control signals intended for defining the command signals that are to feed the command input of each switch means SWj to set them to an open state or a closed state. These second control signals are sent to each multiplexer MX by a second auxiliary external pad EP5 of the corresponding third group G3i, through a control bus B4.

This control bus B4 is also defined in the scribe lanes SL of the wafer W and is connected to the second auxiliary external pad EP5 of each third group G3i and to the second control input of each multiplexer MX of each switch control means SCi belonging to a same row or column.

Each multiplexer MX of a switch control means SCi has a third input which is coupled to the output of the D-type flip-flop DF of the preceding switch control means SCi−1. Moreover, the output of each multiplexer MX is coupled to the command inputs of the corresponding switch means SWj and to an input of its associated D-type flip-flop DF.

The third auxiliary external pad EP6 is intended for receiving clock signals intended for a clock input of the D-type flip-flop DF of the corresponding switch control means SCi. These clock signals allow to control the transfer of a token from one switch control means SCi to the following one SCi+1 through their common control track CLT.

To supply the clock input of these D-type flip-flops DF, another control bus B5 is defined in the scribe lanes SL of the wafer W for each row or column. This control bus B5 is connected to the third auxiliary external pad EP6 of each third group G3i and to the clock input of each D-type flip-flop DF belonging to the same row or column.

The third group G3i allows the moving of the token. In the case were the probe card is positioned on the i-th die (Di), the corresponding switch control means SCi is configured such that the valid multiplexer input is set by the bus B4. This is done by applying a control signal to the auxiliary external pad EP5.

To create the token, an active logical level is applied to bus B5 at each clock period. For the remaining time a non-active logical level is applied. Bus B5 is used to carry the clock signal that controls the token.

At least one of the third groups G3i may also comprise a fourth auxiliary external pad EP7 intended for feeding any internal IC or external ECk integrated component, which it needs during the test, with a chosen supply voltage Vdd. To supply these components IC and ECk, associated with (or belonging to) each die Di, another control bus B6 is defined in the scribe lanes SL of the wafer W, for each row or column. This control bus B6 is connected to the fourth auxiliary external pad EP7 of one or more third group(s) G3i and to each means that each fourth auxiliary external pad EP7 is intended to supply. For instance it supplies the switch control means SCi which corresponds to its third group G3i and/or the switch means SWj and/or the die Di and/or some of the external test integrated components ECk with Vdd.

The connections between the control bus B6 and the means to supply are not realized in FIG. 2 for clarity. Moreover, in the example illustrated in FIG. 2 each third group G3i comprises a fourth auxiliary external pad EP7. But a wafer W may comprise only one fourth auxiliary external pad EP7, at least for one row or column.

At least one of the third groups G3i may also comprise a fifth auxiliary external pad EP8 which is intended for defining ground (Vss) for the wafer W. In this case, another control bus B7 is also provided to connect each fifth auxiliary external pad EP8 of one or more third group(s) G3i of a row or column to each means (internal pad or internal or external integrated component) requiring a connection to ground. In the example illustrated in FIG. 2 each third group G3i comprises a fifth auxiliary external pad EP8. But a wafer W may comprise only one fifth auxiliary external pad EP8, at least for one row or column.

By defining sequences of control signals for the switch control means SCi and then sequences of states for the different switch means SWj associated with each die Di, it is thus possible to test automatically each part of every die D, without mechanically moving the probe card. In other words, this first example of embodiment allows the electronic selection of dies and/or die internal pads IP and/or die internal integrated components IC (and/or external test integrated components of the second group G2) by means of some of the external test integrated components of this second group G2.

In FIG. 2, two dies Di belonging to the same wafer row are illustrated. Therefore, only one control track CLT and one group of buses Bj are sketched. But, when the wafer W comprises several rows or columns one control track CLT and one group of buses Bj are defined in the wafer scribe lanes SL for each row or column.

Reference is now made to FIG. 3 to describe a second example of embodiment of a wafer W according to the invention.

In this second example only one die D1 is realized. But the wafer W according to the invention may comprise more than one identical and independent dies.

Contrary to the first example in which all the integrated components intended for die testing were defined inside the dies and connected directly or indirectly through the internal pads IPj to the external pads EPj, in this second example at least some of the integrated components intended for die testing are defined in the wafer scribe lanes SL. In other words at least some of the test circuits are external to the corresponding die D1.

As is illustrated in FIG. 3, the external test integrated components ECk (here k=1 to 7, for instance) are connected to the internal integrated components or internal test integrated components ICm (here m=1 to 5) either directly through conductive tracks CT or indirectly through conductive tracks CT and internal pad(s) IP. The external test integrated components ECk constitute a second group G2i associated with a die Di. Their number and type depend on the tests to carry out. This number is at least equal to 1 (k>0).

For instance, a first external test circuit comprises a resistor EC1 connected between first and second internal pads (IP), a first polarized capacitor EC2 connected between the second internal pad and a third internal pad, and a second polarized capacitor EC3 connected between the third internal pad and a fourth internal pad. This circuit can be used for filtering (for instance it may be a loop filter of a PLL circuit).

An amplifier EC7 is connected between another internal pad IP and an internal integrated component IC1, in order to amplify the signal delivered by this internal pad before it reaches this internal integrated component.

Another amplifier EC5 is connected between another internal pad IP and an external pad EP1 of the first group G11 in order to amplify the test signals delivered by this internal pad before it reaches the probe card. Such an arrangement may be useful when the signals to be collected are weak.

A polarized capacitor EC4 is connected between two other internal pads IP, for instance in order to act as a filtering or decoupling capacitor between supply rails.

An external integrated component EC6 is connected between another internal integrated component IC2 and another external pad EP2 of the first group G11 in order to amplify the internal signal so that it can be handled by the probe card.

A second group G2i may comprise any type of active or passive external test integrated component, and notably a decoupling capacitor, a resistor, a loop filter, a signal generator, a signal processing component (such as an analog to digital converter (ADC), or a digital to analog converter (DAC) for setting an analog voltage within the die from an external digital signal, or else a multiplexer), a signal conditioning component (such as an amplifier or a buffer), and a sensor (such as a current sensor, a frequency sensor or a noise sensor). [0] These components may have one or several connections to internal die signals. They can also have one, several, or even no connections to external pads EPj. Moreover the signals can be of any type (input, output or supply).

In the schematic example illustrated in FIG. 3, the first group G1i comprises only two external pads EPj intended to be connected to a probe card (for instance through needles, or with any other probing technique). But, each first group G1i may comprise more than two external pads EPj.

It is important to notice that the first and second examples of embodiment may be combined. In other words, it is possible to define into the wafer scribe lanes SL, for each row or column, first groups G1i of external pads EPj with the corresponding buses Bj, third groups G3i of auxiliary external pads EPn with the corresponding buses B4 to B7, a control track CLT, switch means SWj, and second groups G2i of external test integrated components ECk. As mentioned before, this may notably allow an electronic selection of dies Di and/or die internal pads IP and/or die internal integrated components IC and/or external test integrated components of the second group G2, by means of some of the external test integrated components of this second group G2.

The dies, external pads and external test integrated components may be realized in the wafer in CMOS or BiCMOS technology, and more generally in any technology used in (active and passive) integrated circuit manufacturing industry.

The invention offers several advantages amongst which:
it may allow to reduce the time wasted during a test because the wafers do not have to be moved anymore during this test (unless there is a defect in the selection circuitry),
it may allow to reduce die pad size and pitch when the test circuit is at least partially defined in the wafer scribe lanes,
it may allow to prevent damages of the internal pad during the tests, when these internal pads are coupled to the probe card through the external (or clone) pads,
it may allow to save the tester resources and/or needles,
it may allow to improve the accuracy of at least some test measurements,
it may allow to carry out some test measurements that are difficult in industrial environment,
it may allow to simplify some switching, and notably switches of input signals may be avoided and output signals may be combined by means of voltage to current amplifiers,
some external pads may be used to share some functions between dies of a same row or column, and notably for ground (Vss) definition and supply voltage (Vdd) definition,
some external pads may be used to merge inputs, and notably high band (HB) and low band (LB) voltage inputs, or to merge outputs, and notably high band (HB) and low band (LB) current outputs, or high impedance outputs.

The invention is not limited to the embodiments of a wafer described above only as examples, but it encompasses all alternative embodiments which may be considered by one skilled in the art to be within the scope of the claims hereafter.

The invention claimed is:

1. Wafer, comprising at least one independent die, having internal integrated components and a multiplicity of internal pads connected to some of said internal integrated components, and scribe lanes defined between and around each independent die, characterized in that it comprises, defined in at least a part of said scribe lanes, and for each die, at least;
a first group of external pads connected through conductive tracks to a chosen one of the internal pads and/or internal integrated components of the associated die, and arranged to be fed with chosen test signals or to collect test result signals, and;
a second group of external test integrated components connected through conductive tracks to a chosen one of the die internal pads and/or die internal integrated components and/or to external pads of said first group.

2. Wafer according to claim 1, characterized in that, in the presence of at least two independent dies, at least some of the external test integrated components of said second group are dedicated to an electronic selection of dies and/or an electronic selection of die internal pads and/or die internal integrated components and/or other external test integrated components of said second group.

3. Wafer according to claim 1, characterized in that, in the presence of at least two independent and identical dies, it also comprises:
a number of buses equal to the number of external pads associated with one die, a same external pad associated with each die being connected to the associated bus,
a number of switch means equal to the number of external pads associated with one die, each switch means associated with each die being connected to the bus, to which the corresponding external pad is connected, and to the internal pad or internal integrated component associated with said corresponding external pad, and
a control track comprising a number of switch control means equal to the number of dies, each switch control means having an output coupled to a control input of each switch means of the corresponding die and being arranged to deliver selectively on its output command signals intended for setting the corresponding switch means either to a closed state or an open state.

4. Wafer, comprising at least one independent die, having internal integrated components and a multiplicity of internal pads connected to some of said internal integrated components, and scribe lanes defined between and around each independent die, characterized in that it comprises, defined in at least a part of said scribe lanes, and for each die, at least;

a first group of external pads connected through conductive tracks to a chosen one of the internal pads and/or internal integrated components of the associated die, and arranged to be fed with chosen test signals or to collect test result signals;

a second group of external test integrated components connected through conductive tracks to a chosen one of the die internal pads and/or die internal integrated components and/or to external pads of said first group;

a number of third groups of auxiliary external pads equal to the number of dies and each comprising at least a first auxiliary external pad intended for feeding said corresponding switch control means with first control signals to set it either to an active state or a passive state, a second auxiliary external pad intended for feeding said corresponding switch control means with second control signals intended for defining command signals for said control input of each switch means and a third auxiliary external pad intended for feeding said corresponding switch control means with clock signals to control the transfer of a token from said corresponding switch control means to the following one to the control track, and a control bus connected to the second auxiliary external pad of each third group and to said switch control means that each second auxiliary external pad is intended for feeding, and a control bus connected to the third auxiliary external pad of each third group and to said switch control means that each third auxiliary external pad is intended to feed.

5. Wafer according to claim 4, characterized in that at least one of said third groups further comprises a fourth auxiliary external pad intended for feeding at least one switch control means and/or one switch means and/or one die and/or some of said external test integrated components with a chosen supply voltage, and a control bus connected to the fourth auxiliary external pad of each third group and to each means that each fourth auxiliary external pad is intended to feed.

6. Wafer according to claim 4, characterized in that at least one of said third group further comprises a fifth auxiliary external pad intended for defining ground for said wafer, and a control bus connected to the fifth auxiliary external pad of each third group and to each means for which each fifth auxiliary external pad is intended for defining ground.

7. Wafer according to claim 3, characterized in that each switch control means comprises a multiplexer and a D-type flip-flop connected to each other.

8. Wafer according to claim 1, characterized in that said external test integrated components are chosen in a group comprising at least a decoupling capacitor, a resistor, a loop filter, a signal generator, a signal processing component, a signal conditioning component, and a sensor.

9. Wafer according to claim 8, characterized in that said signal processing component is chosen in a group comprising at least an analog to digital converter, a digital to analog converter and a multiplexer.

10. Wafer according to claim 8, characterized in that said signal conditioning component is chosen in a group comprising at least an amplifier and a buffer.

11. Wafer according to claim 8, characterized in that said sensor is chosen in a group comprising at least a current sensor, a frequency sensor and a noise sensor.

* * * * *